US009417641B2

(12) United States Patent
Signoff et al.

(10) Patent No.: US 9,417,641 B2
(45) Date of Patent: Aug. 16, 2016

(54) MEMORY EFFECT REDUCTION USING LOW IMPEDANCE BIASING

(71) Applicant: Marvell World Trade, Ltd., St. Michael (BB)

(72) Inventors: David M. Signoff, Santa Clara, CA (US); Ming He, Fremont, CA (US); Wayne A. Loeb, Belmont, CA (US)

(73) Assignee: Marvell World Trade, Ltd., St. Michael (BB)

( * ) Notice: Subject to any disclaimer, the term of this patent is extended or adjusted under 35 U.S.C. 154(b) by 0 days.

(21) Appl. No.: 14/532,816

(22) Filed: Nov. 4, 2014

(65) Prior Publication Data

US 2015/0123728 A1    May 7, 2015

Related U.S. Application Data

(60) Provisional application No. 61/899,460, filed on Nov. 4, 2013.

(51) Int. Cl.
| | |
|---|---|
| *G05F 1/46* | (2006.01) |
| *H03H 7/01* | (2006.01) |
| *H03F 1/30* | (2006.01) |
| *H03F 3/24* | (2006.01) |
| *H03F 3/26* | (2006.01) |

(52) U.S. Cl.
CPC ........ *G05F 1/46* (2013.01); *H03F 1/301* (2013.01); *H03F 3/245* (2013.01); *H03F 3/265* (2013.01); *H03H 7/0107* (2013.01); *H03F 2200/24* (2013.01); *H03F 2200/453* (2013.01); *H03F 2200/534* (2013.01)

(58) Field of Classification Search
None
See application file for complete search history.

(56) References Cited

U.S. PATENT DOCUMENTS

| | | | | |
|---|---|---|---|---|
| 5,699,014 | A * | 12/1997 | Haefner et al. | 330/253 |
| 6,147,550 | A | 11/2000 | Holloway | |
| 6,255,887 | B1 * | 7/2001 | Adams et al. | 327/326 |
| 6,275,112 | B1 * | 8/2001 | Muza | H03F 3/185 330/296 |
| 6,333,623 | B1 * | 12/2001 | Heisley et al. | 323/280 |
| 6,417,725 | B1 * | 7/2002 | Aram et al. | 327/541 |
| 7,026,802 | B2 * | 4/2006 | Gradinariu | 323/316 |
| 7,471,107 | B1 * | 12/2008 | Fortin | H03K 19/00384 326/83 |
| 7,898,332 | B2 * | 3/2011 | Deguchi et al. | 330/259 |

(Continued)

OTHER PUBLICATIONS

International Search Report and Written Opinion for PCT/US2014/063912, filed Nov. 4, 2014.

(Continued)

*Primary Examiner* — Thomas J Hiltunen

(57) ABSTRACT

A circuit includes a bias circuit for a biased transistor. The bias circuit includes a master-slave source follower circuit, a reference transistor, and a bias circuit voltage output coupled to the biased transistor and configured to provide a bias voltage. The reference transistor has a transconductance substantially identical to a transconductance of the biased transistor. A signal ground circuit may be coupled between the biased transistor and one or more components of the bias circuit that do not generate significant return currents to a power supply ground. A method includes generating a current in a reference transistor according to a first voltage generated using a master source follower circuit, generating a second voltage substantially identical to the first voltage using a slave source follower circuit, and providing the second voltage to a biased transistor. The reference transistor has a transconductance substantially identical to a transconductance of the biased transistor.

20 Claims, 3 Drawing Sheets

(56) References Cited

U.S. PATENT DOCUMENTS

| | | | | |
|---|---|---|---|---|
| 8,058,938 | B2 * | 11/2011 | Aga et al. | 331/117 FE |
| 8,378,658 | B2 * | 2/2013 | Schie | H03K 17/166 323/313 |
| 8,878,513 | B2 * | 11/2014 | Wong | G05F 1/56 323/267 |
| 8,901,987 | B1 * | 12/2014 | Le et al. | 327/333 |
| 2004/0239423 | A1 | 12/2004 | Hwang et al. | |
| 2008/0061893 | A1 * | 3/2008 | Lakshmikumar et al. | 331/57 |
| 2008/0129256 | A1 * | 6/2008 | La Placa | G11C 16/30 323/234 |
| 2009/0273397 | A1 | 11/2009 | Bockelman et al. | |
| 2009/0289715 | A1 | 11/2009 | Sengupta et al. | |
| 2010/0109781 | A1 | 5/2010 | Deguchi et al. | |
| 2012/0049951 | A1 * | 3/2012 | Venkataraman | G11C 27/026 330/112 |
| 2012/0139638 | A1 * | 6/2012 | Kaviani et al. | 330/289 |
| 2014/0340058 | A1 * | 11/2014 | Wang | 323/268 |
| 2015/0002110 | A1 * | 1/2015 | Singh | G05F 1/56 323/265 |

OTHER PUBLICATIONS

Nuno Borges De Carvalho et al., "A Comprehensive Explanation of Distortion Sideband Asymmetries," IEEE Transactions on Microwave Theory and Techniques, Sep. 2002, pp. 2090-2101, vol. 50, No. 9.

* cited by examiner

MEMORY EFFECT REDUCTION USING LOW IMPEDANCE BIASING

CROSS REFERENCE TO RELATED APPLICATION

The present disclosure claims the benefit of U.S. Provisional Application No. 61/899,460, filed on Nov. 4, 2013, which is incorporated by reference herein in its entirety.

BACKGROUND

The amplitude of the output of an idealized amplifier at a point in time depends only on the amplitude of the input to the amplifier at that time. A non-linearity is a deviation of the behavior of a real amplifier from the idealized amplifier.

A memory effect is a form of non-linearity where the amplitude of the output of a (non-ideal) amplifier is affected by the amplitude of the input at a plurality of prior points in time. The non-linearity caused by memory effects introduces distortion into the output of the amplifier.

Memory effects may be caused by feedback loops within the amplifier that have substantial time constants, such as Automatic Gain Control (AGC) circuits and bias circuits.

SUMMARY

In an embodiment, a circuit includes a bias circuit for a biased transistor. The bias circuit includes a master-slave source follower circuit, a reference transistor, and a bias circuit voltage output coupled to the biased transistor and configured to provide a bias voltage. The reference transistor has a first transconductance substantially identical to a second transconductance of the biased transistor.

In an embodiment, the master-slave source follower circuit includes a master transistor configured to operate as a first source follower and provide a master reference voltage to the reference transistor, and a slave transistor configured to operate as a second source follower and provide the bias voltage according to the master reference voltage.

In an embodiment, the bias circuit further includes a filter circuit coupled between the bias circuit voltage output and the biased transistor. The filter circuit is configured to present a first impedance at a first frequency and a second impedance at a second frequency. The first frequency is substantially higher than the second frequency, and the first impedance is substantially higher than the second impedance.

In an embodiment, the circuit further includes a signal ground circuit coupled between the biased transistor and one or more components of the bias circuit. Components of the bias circuit that are directly connected to the signal ground circuit do not generate significant return currents to a power supply ground.

In an embodiment, the reference transistor is substantially identical to the biased transistor.

In an embodiment, the circuit further includes a coil having an end tap and a center tap. The end tap is coupled to a gate of the biased transistor, and the center tap is coupled to the bias circuit voltage output.

In an embodiment, the circuit further includes a current source configured to generate a first current. The bias circuit is configured to generate a second current through the reference transistor that is substantially identical to the first current.

In an embodiment, the circuit is provided in a single integrated circuit chip.

In an embodiment, a method includes generating a current in a reference transistor according to a first voltage generated using a master source follower circuit of a bias circuit, generating a second voltage substantially identical to the first voltage using a slave source follower circuit of the bias circuit, and providing the second voltage to a biased transistor. The reference transistor has a first transconductance substantially identical to a second transconductance of the biased transistor.

In an embodiment, the reference transistor is substantially identical to the biased transistor.

In an embodiment, the method further includes filtering the second voltage using a filter circuit of the bias circuit. The filter circuit presents a first impedance at a first frequency and a second impedance at a second frequency. The first frequency is substantially higher than the second frequency, and the first impedance is substantially higher than the second impedance.

In an embodiment, the method further includes providing a signal ground reference to one or more components of the bias circuit using a signal ground circuit. The ground circuit is connected to a power ground network at a location near the biased transistor. Components of the bias circuit that are directly connected to the signal ground circuit do not generate significant return currents to the power supply ground.

In an embodiment, providing the second voltage to the biased transistor includes providing the second voltage to a center tap of a coil. The biased transistor is coupled to an end tap of the coil.

DETAILED DESCRIPTION

Figure 1:
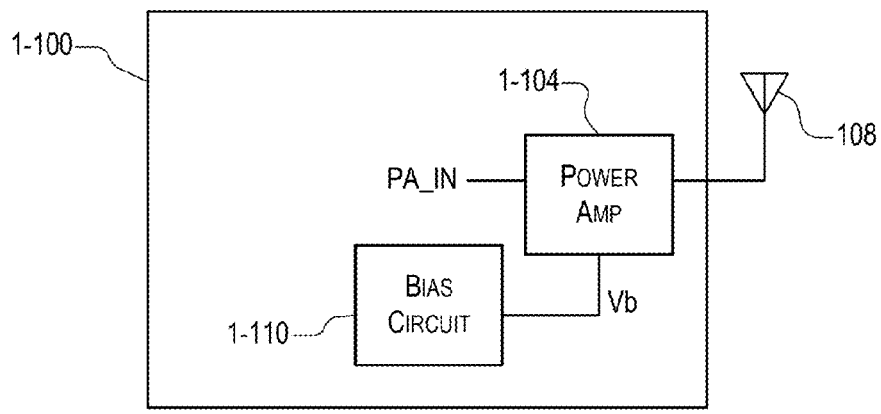
FIG. 1 is a block diagram of an integrated circuit according to an embodiment.

FIG. 1 is a block diagram of an integrated circuit (IC) 1-100 according to an embodiment of the present disclosure. The IC 1-100 includes a power amplifier (PA) 1-104 and a bias circuit 1-110. The output of the PA 1-104 is connected to an antenna 108. In an embodiment, the PA 1-104 is a push-pull amplifier.

An input signal PA_IN is provided to the PA 1-104. The bias circuit 1-110 provides a bias voltage $V_b$ to the PA 1-104.

Although FIG. 1 shows the output PA 1-104 connected to the antenna 108, embodiments are not limited thereto. In an embodiment, the output of the PA 1-104 could be connected to a sonic transducer, an optical transducer, a mechanical transducer, another amplifier, a transmission line, and the like.

Figure 2:
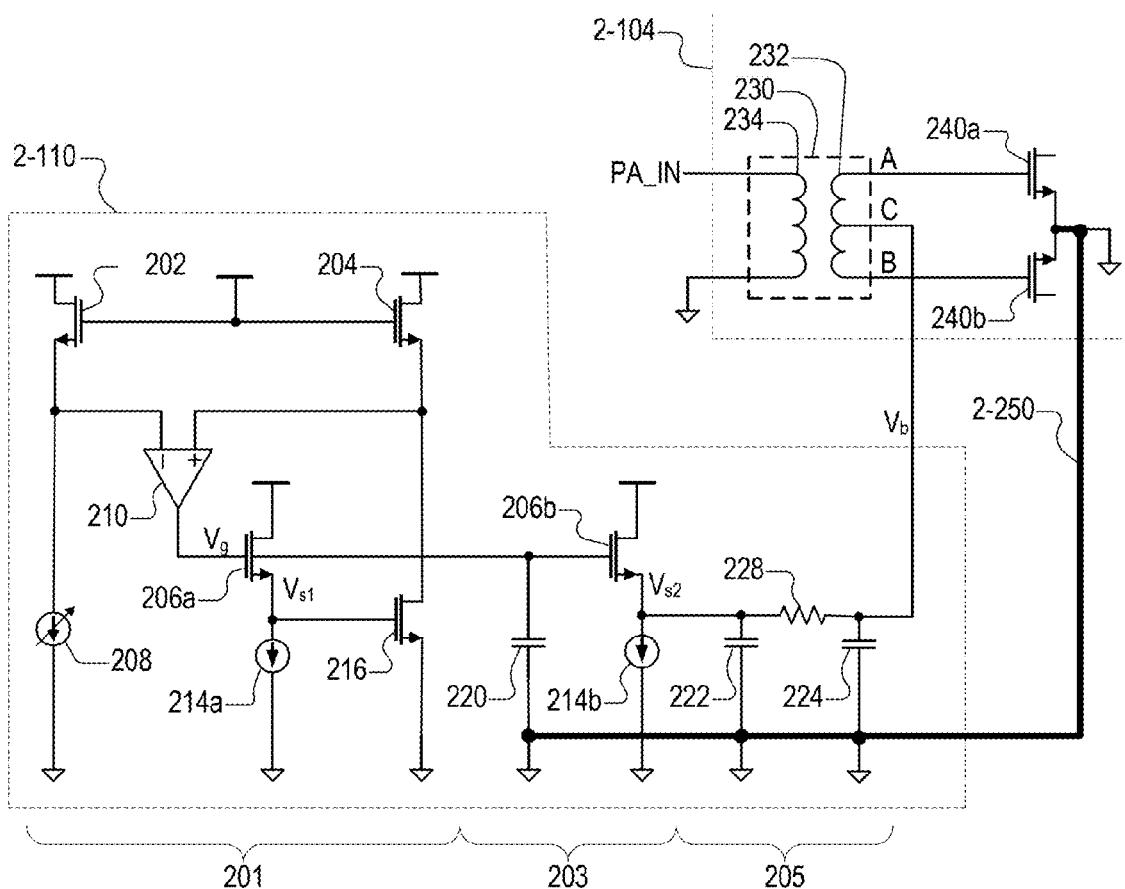
FIG. 2 is a diagram of a circuit according to an embodiment.

FIG. 2 is a diagram of a bias circuit 2-110 suitable for use in the bias circuit 1-110 of FIG. 1. Also shown is a subcircuit of a PA 2-104 suitable for use in the PA 1-104 of FIG. 1. The bias circuit 2-110 provides a bias voltage $V_b$ to the PA 2-104.

The PA 2-104 includes a transformer 230 including a primary coil 234 and a secondary coil 232. First and second end taps A and B of the secondary coil 232 are connected to gates of N-channel Metal-Oxide-Semiconductor (NMOS) first and second transistors 240a and 240b, respectively.

Sources of the first and second transistors 240a and 240b are electrically connected to each other, to a power ground (conventionally indicated in FIG. 2 by an inverted triangle), and to a signal ground circuit 2-250. The power ground is provided using a power ground network (not shown). The signal ground circuit 2-250 includes conductive elements other than the conductive elements of the power ground network.

The bias voltage $V_b$ is provided to the center tap C of the secondary coil 232 and operates to bias the first and second transistors 240a and 240b. An input signal PA_IN is provided to the primary coil 234. The secondary coil 232 presents a first impendence at a high frequency and a second impedance lower than the first impendence at a low frequency. In an embodiment, the high frequency is a frequency of a radio-frequency carrier signal, and the low frequency is a frequency of a baseband signal that is used to modulate the carrier signal.

In an embodiment, the first and second transistors 240a and 240b have substantially identical transconductances. Trans conductance is defined as the ratio of the current variation at the output of a transistor to the corresponding voltage variation at the input (e.g., a gate) of the transistor.

The bias circuit 2-110 includes a bias voltage generator 201. The bias voltage generator 201 includes NMOS third and fourth transistors 202 and 204, a programmable current source 208, an operational amplifier (opamp) 210, and an NMOS reference transistor 216.

Drains of the third and fourth transistors 202 and 204 are connected to a power supply voltage. Gates of the third and fourth transistors 202 and 204 are connected to each other and to the power supply voltage.

A source of the third transistor 202 is connected to a negative input of the opamp 210 and to a first terminal of the programmable current source 208. A second terminal of the programmable current source 208 is connected to the power ground. The third transistor 202 and the programmable current source 208 form a reference leg of a current mirror circuit.

The programmable current source 208 is controlled to generate a target current $I_{targ}$. In an embodiment, the programmable current source 208 includes a Digital to Analog Converter (DAC).

A source of the fourth transistor 204 is connected to a positive input of the opamp 210 and to a drain of the reference transistor 216. A source of the reference transistor 216 is connected to the power ground. The fourth transistor 204 and the reference transistor 216 form a mirror leg of the current mirror circuit.

The bias voltage generator 201 further includes a master source follower including an NMOS master transistor 206a and a first constant current source 214a.

A drain of the master transistor 206a is connected to the supply voltage. A gate of the master transistor 206a is connected to an output of the opamp 210. A source of the master transistor 206a is connected to a gate of the reference transistor 216 and a terminal of the first constant current source 214a. A second terminal of the first constant current source 214a is connected to the power ground.

The bias voltage generator 201 operates to produce a gate voltage $V_g$ at the gate of the master transistor 206a. The gate voltage $V_g$ produces a first source voltage (or master reference voltage) $V_{s1}$ at the source of the master transistor 206a. The first source voltage $V_{s1}$ is provided to the gate of the reference transistor 216 and causes a current substantially equal to the target current $I_{targ}$ to flow through the reference transistor 216.

In an embodiment, a first transconductance of the reference transistor 216 is substantially identical to a second transconductance of the first transistor 240a. In such an embodiment, providing a voltage substantially equal to the first source voltage $V_{s1}$ to the gate of the first transistor 240a produces a current in the first transistor 240a that is substantially equal to the target current $I_{targ}$.

In an embodiment, the first and second transistors 240a and 240b are substantially identical and the reference transistor 216 is a replica of (that is, is substantially physically identical to) the first transistor 240a.

The bias circuit 2-110 further includes a follower circuit 203 including a first capacitor 220, an NMOS slave transistor 206b, and a second constant current source 214b. The follower circuit 203 operates as a slave source follower to produce a second source voltage $V_{s2}$ substantially equal to the first source voltage $V_{s1}$.

The gate voltage $V_g$ provided to the gate of the master transistor 206a is also provided to a gate of the slave transistor 206b and to a first terminal of the first capacitor 220. A second terminal of the first capacitor 220 is connected to the power ground and to the signal ground circuit 2-250.

A drain of the slave transistor 206b is connected to the supply voltage. A source of the slave transistor 206b is connected to a first terminal of the second constant current source 214b. A second terminal of the second constant current source 214b is connected to the power ground.

The master and slave transistors 206a and 206b are components of a master-slave source follower circuit. In an embodiment, the master and slave transistors 206a and 206b are substantially identical. In an embodiment, the first and second constant current sources 214a and 214b produce substantially identical currents.

The opamp 210, master transistor 206a, and reference transistor 216 are components of a feedback loop of the bias voltage generator 201. The slave transistor 206b is not a component of the feedback loop.

The bias circuit 2-110 further includes a Capacitor-Resistor-Capacitor (CRC) filter circuit 205. A first terminal of the CRC filter circuit 205 receives the second source voltage $V_{s2}$. A second terminal of the CRC filter circuit 205 serves as a bias circuit voltage output that provides the bias voltage $V_b$.

The CRC filter circuit 205 includes second and third capacitors 222 and 224 and a resistor 228. A first terminal of the second capacitor 222 receives the second source voltage $V_{s2}$ and is connected to a first terminal of the resistor 228. A first terminal of the third capacitor 224 is connected to a second terminal of the resistor 228 and may be the bias circuit voltage output for the bias circuit 2-110. The bias circuit voltage output provides the bias voltage $V_b$.

Second terminals of the second and third capacitors 222 and 224 are each connected to both the power ground and the signal ground. That is, components of the bias circuit 2-110 that do not have substantial ground currents are connected to the PA 2-104 by the signal ground circuit 2-250.

The CRC filter circuit 205 presents a low first impedance to first signals having a first frequency and a high second impedance to second signals having a second frequency substantially higher than the first frequency. In an embodiment where the input signal PA_IN includes a carrier signal having a carrier frequency, wherein the carrier signal has been modulated using a baseband signal having a baseband frequency substantially lower than the carrier frequency, the CRC filter circuit 205 provides a low impedance at the baseband frequency and a high impedance at the carrier frequency.

The follower circuit 203 has a small, real impedance and operates to isolate the feedback loop of the bias voltage generator 201 from the load connected to the bias circuit voltage output. The filter circuit 205 and the transformer 230 operate to isolate the bias voltage generator 201 from the PA 2-104 at high frequencies. The signal ground circuit 2-250 operates so that a voltage level of a ground in the bias circuit 2-110 tracks a voltage level of a ground in the PA 2-104. These operations reduce or eliminate memory effects caused by the bias circuit 2-110.

Although the transistors of the embodiment shown in FIG. 2 are NMOS transistors, embodiments are not limited thereto. In an embodiment, the reference transistor 216 and the first and second transistors 240a and 240b are Junction Field-Effect Transistors (JFETs). In another embodiment, the reference transistor 216 and the first and second transistors 240a and 240b are bipolar transistors.

Figure 3A:
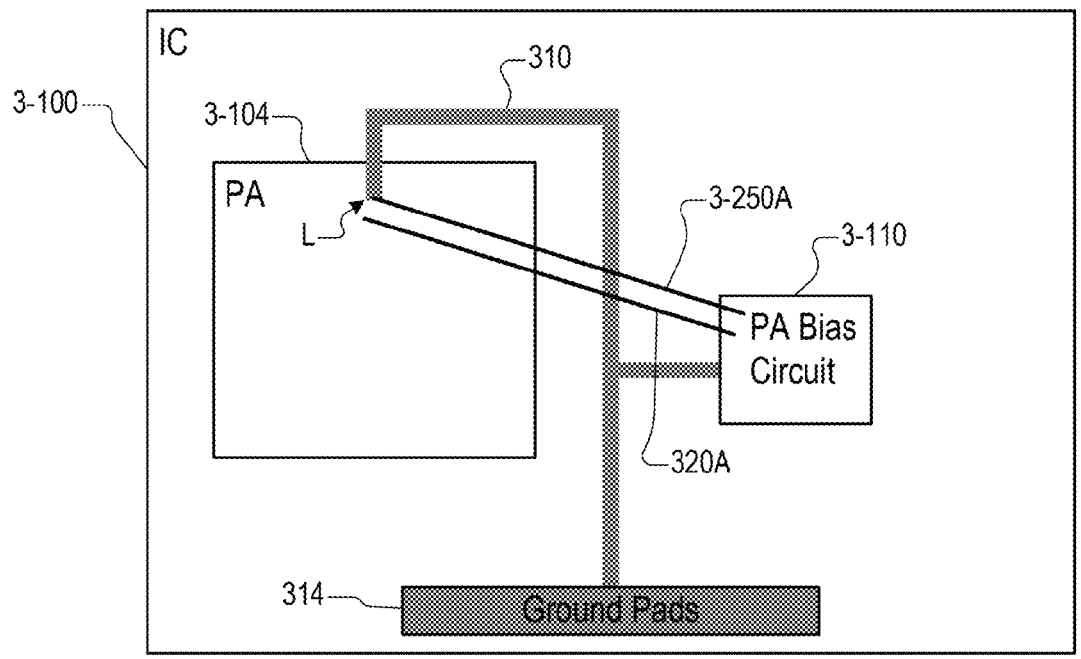
FIG. 3A illustrates a layout of an integrated circuit according to an embodiment.

FIG. 3A illustrates a physical layout of an integrated circuit 3-100 according to an embodiment. The integrated circuit includes a Power Amplifier (PA) 3-104 and a bias circuit 3-110. The bias circuit 3-110 provides a bias voltage to an input circuit within the PA 3-104 using a bias voltage conductor 320A.

The integrated circuit 3-100 further includes a power ground network 310 and a signal ground circuit 3-250A. The power ground network 310 comprises one or more conductive elements that provide power ground to the PA 3-104 and the bias circuit 3-110, providing a return path through which return currents flow to ground pads 314. The conductive elements may include one or more conductive traces on any of one or more metal layers of the integrated circuit and one or more conductive vias between two conductive traces located on different metal layers of the integrated circuit.

The signal ground circuit 3-250A is connected to the power ground network 310 at a location L near an input circuit of the PA 3-104. The signal ground circuit 3-250A is also connected to components within the bias circuit 3-110.

In an embodiment, the signal ground circuit 3-250A is only connected to components of bias circuit 3-110 that do not respectively generate significant return currents to the ground pads 314, that is, the signal ground circuit 3-250A is only connected to components of the bias circuit 3-110 that do not draw significant current from the power supply voltage. In an embodiment, the signal ground circuit 3-250A is connected only to components within the bias circuit 3-110 and connected to the power ground network 310 only at one or more locations within the input circuit of the PA 3-104.

Using the signal ground circuit 3-250A to provide a signal ground reference to the bias circuit 3-110 results in a voltage of the signal ground reference being substantially identical to a voltage of the power ground network 310 at the location L.

In the embodiment shown in FIG. 3A, the signal ground circuit 3-250A is laid out on a substantially straight path directly from the bias circuit 3-110 to the location L. In an embodiment, the bias voltage conductor 320A is laid out on a path close to and substantially similar to the path of the signal ground circuit 3-250A.

Figure 3B:
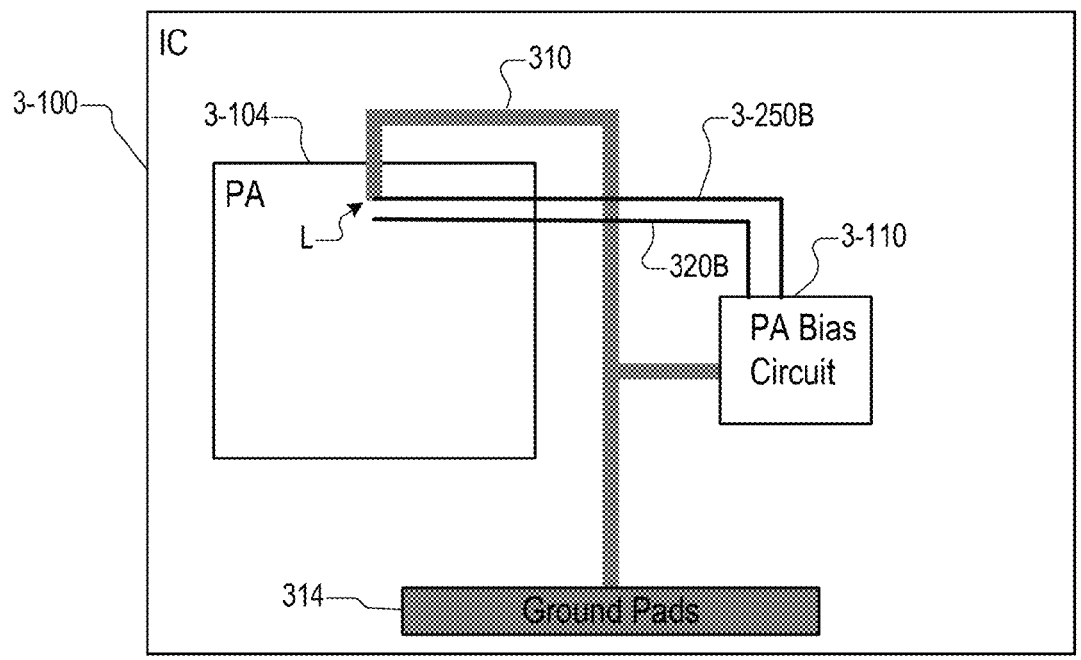
FIG. 3B illustrates a layout of an integrated circuit according to another embodiment.

FIG. 3B illustrates a physical layout of the integrated circuit 3-100 according to an embodiment. The embodiment of FIG. 3B differs from the embodiment of FIG. 3A in that the signal ground circuit 3-250B is laid out on a path comprising horizontal and vertical segments. The horizontal elements extend substantially parallel to a first edge of the integrated circuit 3-100, and the vertical elements extend substantially orthogonal to the first edge. In an embodiment, the bias voltage conductor 320B is laid out on a path close to and substantially similar to the path of the signal ground circuit 3-250B.

Figure 4:
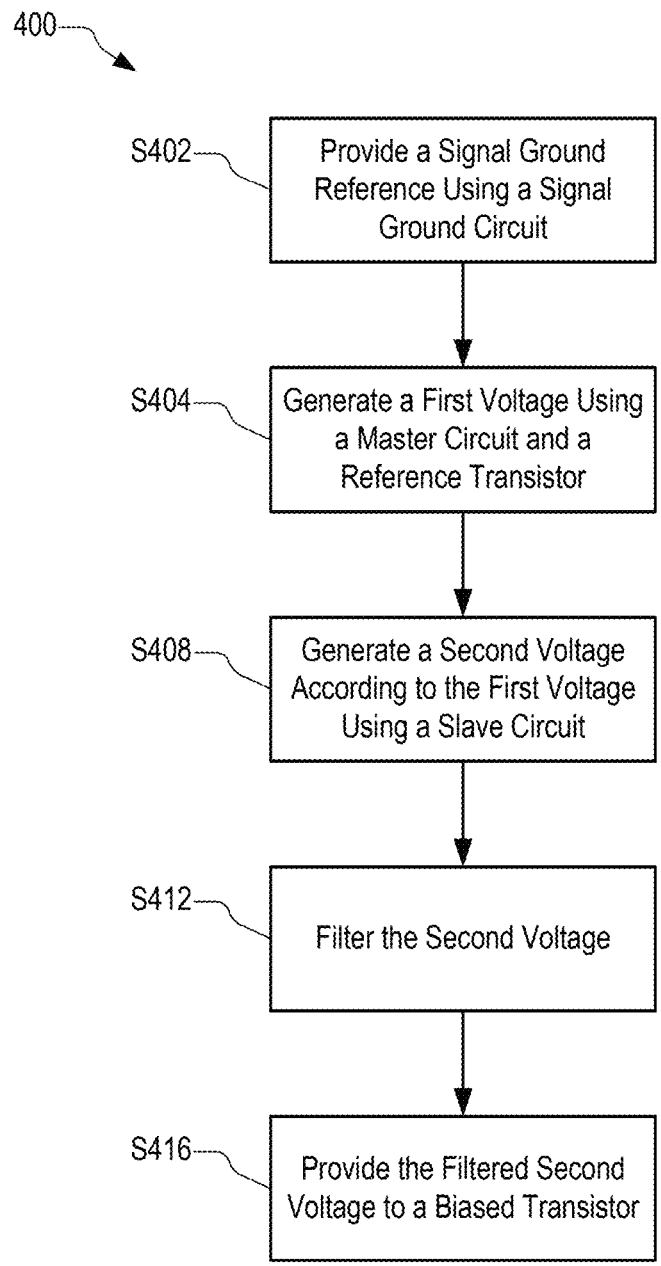
FIG. 4 illustrates a process of biasing a transistor.

FIG. 4 illustrates a process 400 of biasing, using a bias circuit, a biased transistor.

At S402, a signal ground reference is provided, using a signal ground circuit, to components of the bias circuit that do not generate return currents in a power ground network. In an embodiment, the signal ground circuit is connected to the power ground network only at locations near the biased transistor. In an embodiment, some or all components of the bias circuit that generate significant return currents are not directly connected to the signal ground circuit. In an embodiment, components directly connected to the signal ground circuit include only one or more of the biased transistor, components near the biased transistor, and components of the bias circuit.

Conductive elements of the signal ground circuit are electrically isolated from a power ground network. Using the signal ground circuit to provide the signal ground reference to the bias circuit produces a signal ground reference that has a voltage substantially identical to the voltage of the power ground network at the location near the biased transistor.

At S404, a first voltage is generated using a master source follower circuit and a reference transistor, each included in the bias circuit. In an embodiment, the first voltage is a voltage producing a first current in the reference transistor. The first current is substantially identical to a reference current produced by a current source. In an embodiment, the current source is a programmable current source.

The reference transistor has a first transconductance substantially identical to a second transconductance of the biased transistor. In an embodiment, the reference transistor is a replica of the biased transistor, that is, the reference transistor is a substantially identical physical duplicate of the biased transistor.

In an embodiment, the master source follower circuit provides the first voltage to a gate of the reference transistor, and the master source follower circuit and the reference transistor are components of a feedback loop.

At S408, a second voltage is generated according to the first voltage using a slave source follower circuit of the bias circuit. The second voltage is substantially identical to the first voltage. In an embodiment, the slave source follower circuit is not a component of the feedback loop.

At S412, the second voltage is filtered using a filter circuit of the bias circuit. The filter circuit presents a first impedance to the second voltage at a first frequency, and a second impedance to the second voltage at a second frequency. The first impedance is substantially higher than the second impedance, and the first frequency is substantially higher than the second frequency.

In an embodiment, the first frequency is a frequency of a carrier signal, the second frequency is a frequency of a baseband signal, and the biased transistor receives an input signal comprising the carrier signal modulated using the baseband signal.

In an embodiment, the filter circuit is a capacitor-resistor-capacitor filter circuit.

At S416, the filtered second voltage is provided to the biased transistor. In an embodiment, the filtered second voltage is provided to a gate of the biased transistor. In an embodiment, the filtered second voltage is provided to the biased transistor through a coil. The coil may be a center-tapped coil, wherein the filtered second voltage is provided to the center tap of the coil, and the biased transistor is coupled to an end tap of the coil. The coil may be a coil of a transformer.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A circuit comprising:
   a bias circuit for a biased transistor, the bias circuit including a master-slave source follower circuit, a reference transistor, and a bias circuit voltage output coupled to a gate of the biased transistor and configured to provide a bias voltage; and
   a filter circuit coupled between the bias circuit voltage output and the biased transistor, the filter circuit configured to present a first impedance at a first frequency and a second impedance at a second frequency,
   wherein the reference transistor has a first transconductance substantially identical to a second transconductance of the biased transistor, wherein the gate of the biased transistor receives an additional input signal
   wherein the first frequency is substantially higher than the second frequency, and
   wherein the first impedance is substantially higher than the second impedance.

2. The circuit of claim 1, wherein the master-slave source follower circuit comprises:
   a master transistor configured to operate as a first source follower and provide a master reference voltage to the reference transistor; and
   a slave transistor configured to operate as a second source follower and provide the bias voltage according to the master reference voltage.

3. The circuit of claim 2, wherein a gate of the master transistor is coupled to a gate of the slave transistor.

4. The circuit of claim 2, wherein the master transistor includes an NMOS transistor and wherein the slave transistors include an NMOS transistor.

5. The circuit of claim 1, wherein the first frequency is a frequency of a carrier signal,
   wherein the second frequency is a frequency of a baseband signal, and
   wherein the biased transistor is a component of an amplifier configured to amplify the additional input signal, the additional input signal including the carrier signal modulated according to the baseband signal.

6. The circuit of claim 1, wherein the filter circuit includes a capacitor-resistor-capacitor filter circuit.

7. The circuit of claim 1, further comprising:
   a signal ground circuit coupled between the biased transistor and one or more components of the bias circuit,
   wherein components of the bias circuit that are directly connected to the signal ground circuit do not generate significant return currents to a power supply ground.

8. The circuit of claim 7, wherein all the components of the bias circuit that are directly connected to the signal ground circuit do not generate significant return currents to a power supply ground.

9. The circuit of claim 7, wherein the signal ground circuit is directly connected to a power ground network at a location near the biased transistor.

10. The circuit of claim 9, wherein the signal ground circuit is directly connected to a power ground network only at a location near the biased transistor.

11. The circuit of claim 1, wherein the reference transistor is substantially identical to the biased transistor.

12. The circuit of claim 1, further comprising:
    a current source configured to generate a first current,
    wherein the bias circuit is configured to generate a second current through the reference transistor that is substantially identical to the first current.

13. The circuit of claim 12, wherein the current source is a programmable current source.

14. The circuit of claim 1, wherein the circuit is provided in a single integrated circuit chip.

15. A circuit comprising:
    a bias circuit for a biased transistor, the bias circuit including a master-slave source follower circuit, a reference transistor, and a bias circuit voltage output coupled to a gate of the biased transistor and configured to provide a bias voltage; and
    a coil having an end tap and a center tap,
    wherein the reference transistor has a first transconductance substantially identical to a second transconductance of the biased transistor,
    wherein the end tap is coupled to a gate of the biased transistor, and
    wherein the center tap is coupled to the bias circuit voltage output.

16. The circuit of claim 15, wherein the coil is a coil of a transformer.

17. A method comprising:
    generating a current in a reference transistor according to a first voltage generated using a master source follower circuit of a bias circuit;
    generating a second voltage substantially identical to the first voltage using a slave source follower circuit of the bias circuit;
    filtering the second voltage using a filter circuit of the bias circuit;
    providing the second voltage to a gate of a biased transistor; and
    providing an additional input voltage to the gate of the biased transistor,
    wherein the reference transistor has a first transconductance substantially identical to a second transconductance of the biased transistor,
    wherein the filter circuit presents a first impedance at a first frequency and a second impedance at a second frequency,
    wherein the first frequency is substantially higher than the second frequency, and
    wherein the first impedance is substantially higher than the second impedance.

18. The method of claim 17, wherein the reference transistor is substantially identical to the biased transistor.

19. The method of claim 17, further comprising:
    providing a signal ground reference to one or more components of the bias circuit using a signal ground circuit,
    wherein the ground circuit is connected to a power ground network at a location near the biased transistor, and
    wherein components of the bias circuit that are directly connected to the signal ground circuit do not generate significant return currents to the power supply ground.

20. The method of claim 17, wherein providing the second voltage to the biased transistor comprises:
    providing the second voltage to a center tap of a coil,
    wherein the biased transistor is coupled to an end tap of the coil.

* * * * *